US007977167B2

(12) United States Patent
Hofmann et al.

(10) Patent No.: US 7,977,167 B2
(45) Date of Patent: Jul. 12, 2011

(54) METHOD OF PRODUCING A FIELD EFFECT TRANSISTOR ARRANGEMENT

(75) Inventors: Karl Hofmann, Munich (DE); Luis-Felipe Giles, Munich (DE)

(73) Assignee: Infineon Technologies AG (DE)

( * ) Notice: Subject to any disclaimer, the term of this patent is extended or adjusted under 35 U.S.C. 154(b) by 0 days.

(21) Appl. No.: 12/604,771

(22) Filed: Oct. 23, 2009

(65) Prior Publication Data
US 2010/0041185 A1 Feb. 18, 2010

Related U.S. Application Data

(62) Division of application No. 11/678,334, filed on Feb. 23, 2007, now abandoned.

(51) Int. Cl.
*H01L 21/84* (2006.01)
(52) U.S. Cl. .................. 438/149; 257/E21.563
(58) Field of Classification Search .......... 257/49, 257/64, 213, 288, 347, 348, 349, 350, 351, 257/352, 353, 354, E21.001, E21.532, E21.536, 257/E21.54, E21.545, E21.561–E21.569; 438/142, 149–166, 455, 456, 457, 458, 459
See application file for complete search history.

(56) References Cited

U.S. PATENT DOCUMENTS

| 5,723,372 | A * | 3/1998 | Campisano et al. ......... 438/164 |
| 7,298,009 | B2 | 11/2007 | Yan et al. |
| 7,354,806 | B2 | 4/2008 | Doris et al. |
| 7,432,149 | B2 | 10/2008 | Wu et al. |
| 2005/0067055 | A1 * | 3/2005 | Choe et al. .................. 148/239 |
| 2005/0176222 | A1 | 8/2005 | Ogura |
| 2006/0017137 | A1 * | 1/2006 | Iwamatsu ..................... 257/627 |
| 2006/0060925 | A1 | 3/2006 | Doris et al. |
| 2006/0073646 | A1 | 4/2006 | Yang |
| 2007/0197033 | A1 | 8/2007 | Wilson |

OTHER PUBLICATIONS

Chang, Leland; "CMOS Circuit Performance Enhancement by Surface Orientation Optimization"; IEEE Transactions on Electron Devices, Vol. 51, No. 10, Oct. 2004, pp. 1621-1627. **.
Yang, M. et al.; "On the Integration of CMOS with Hybrid Crystal Orientation"; Jun. 2004, Symposium on VLSI Technology, Digest of Technical Papers, p. 160-161. **
Yang, M. et al.; "High Performance CMOS Fabricated on Hybrid Substrate With Different Crystal Orientations"; IEDM 2003, Dec. 2003, p. 18.7.1.-18.7.4., IEEE.

* cited by examiner

*Primary Examiner* — Minh-Loan T Tran
*Assistant Examiner* — Kevin Quinto
(74) *Attorney, Agent, or Firm* — Dickstein Shapiro LLP

(57) ABSTRACT

A method of producing a field effect transistor arrangement. A substrate having a first crystal surface orientation is provided. A first layer is formed above a first portion of the substrate, the first layer having a second crystal surface orientation different from the first crystal surface orientation. A second layer is formed on at least a second portion of the substrate and adjacent to the first layer, the second layer having the first crystal surface orientation. A first buried oxide layer is formed between the substrate and the first layer. Micro-cavities are formed in the second layer and oxidizing the micro-cavities, thereby forming a second buried oxide layer between the substrate and the second layer. A first field effect transistor of a first conductivity type is formed in or on the first layer. A second field effect transistor of a second conductivity type is formed in or on the second layer.

17 Claims, 9 Drawing Sheets

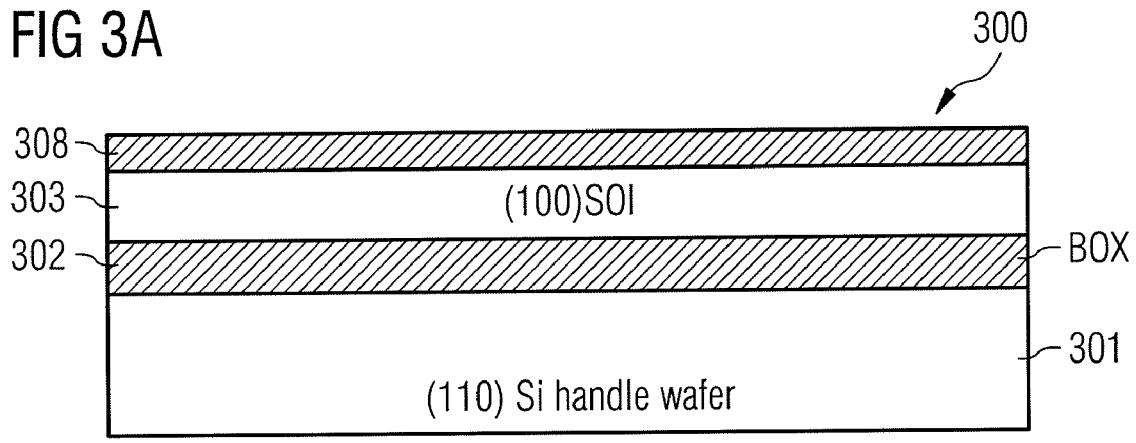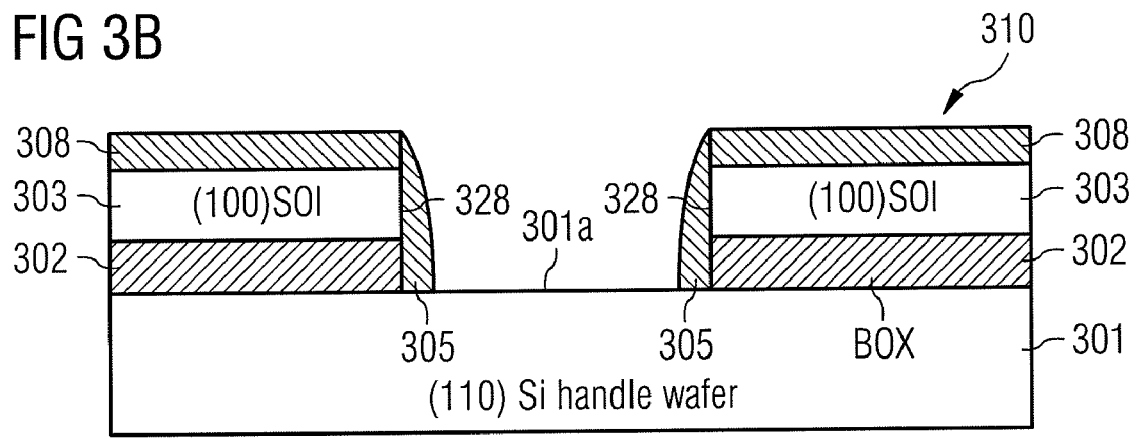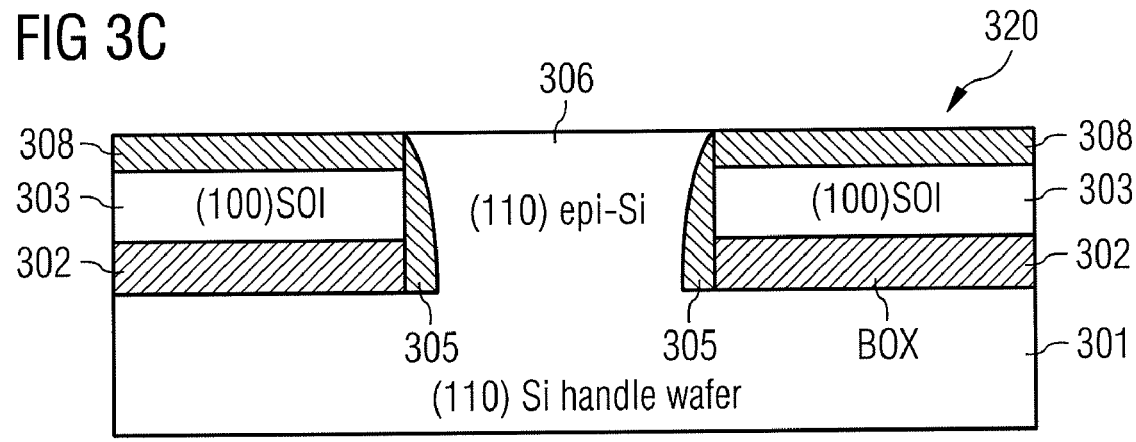

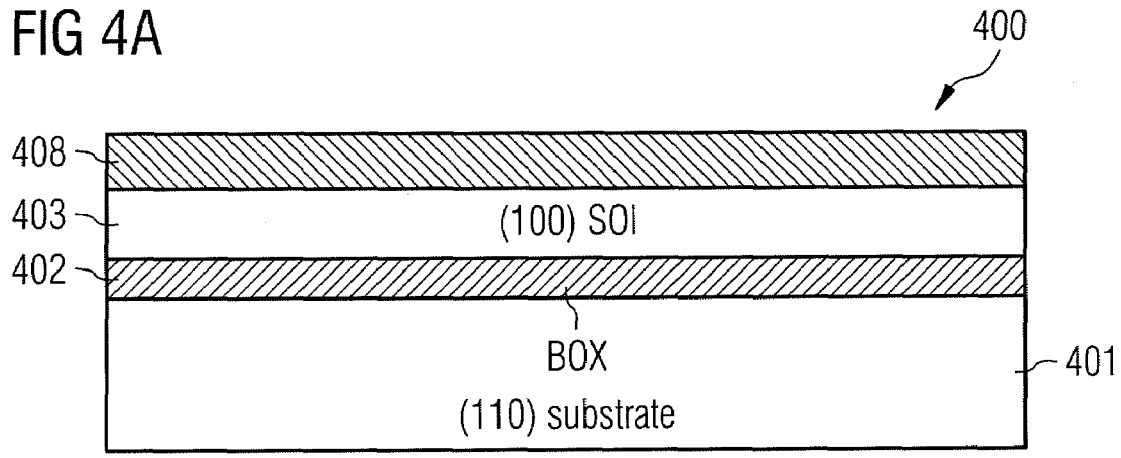
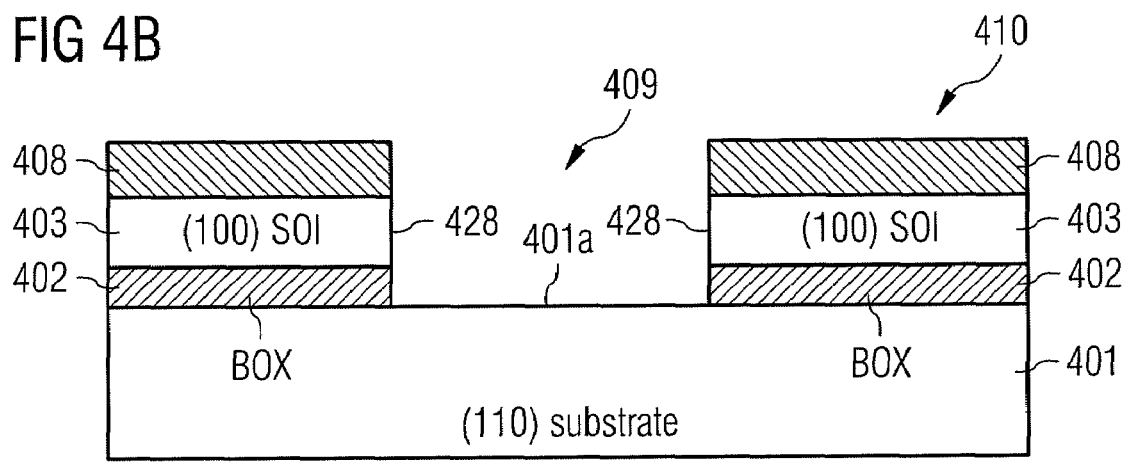
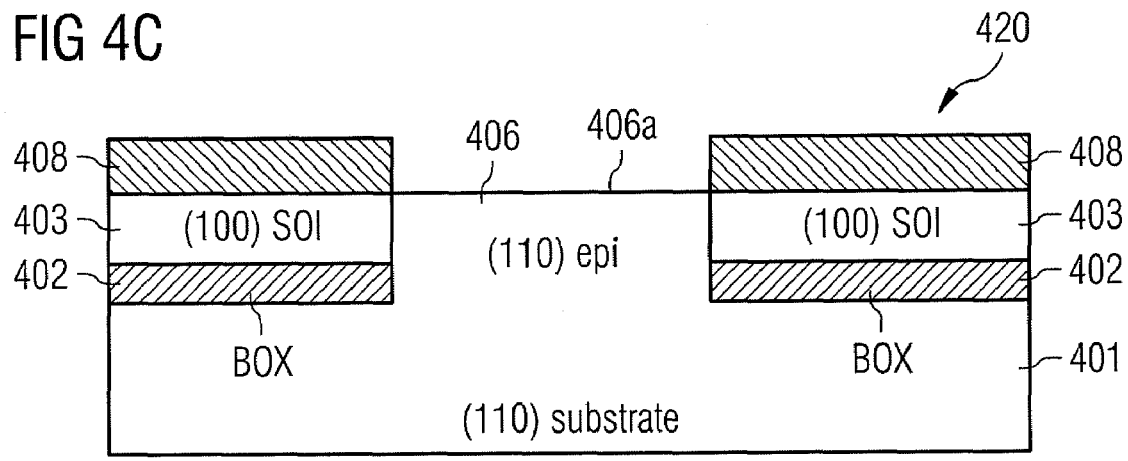

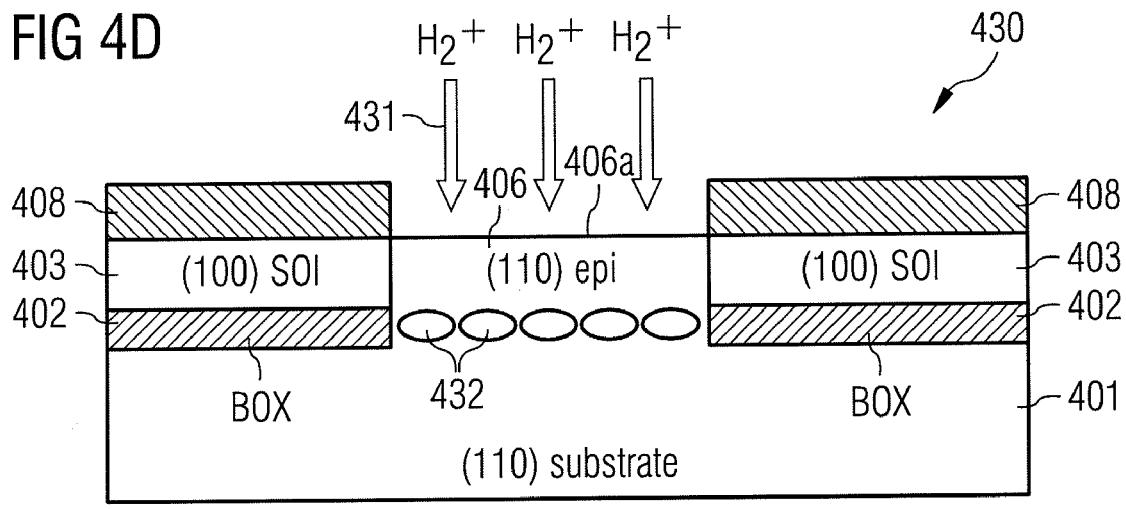
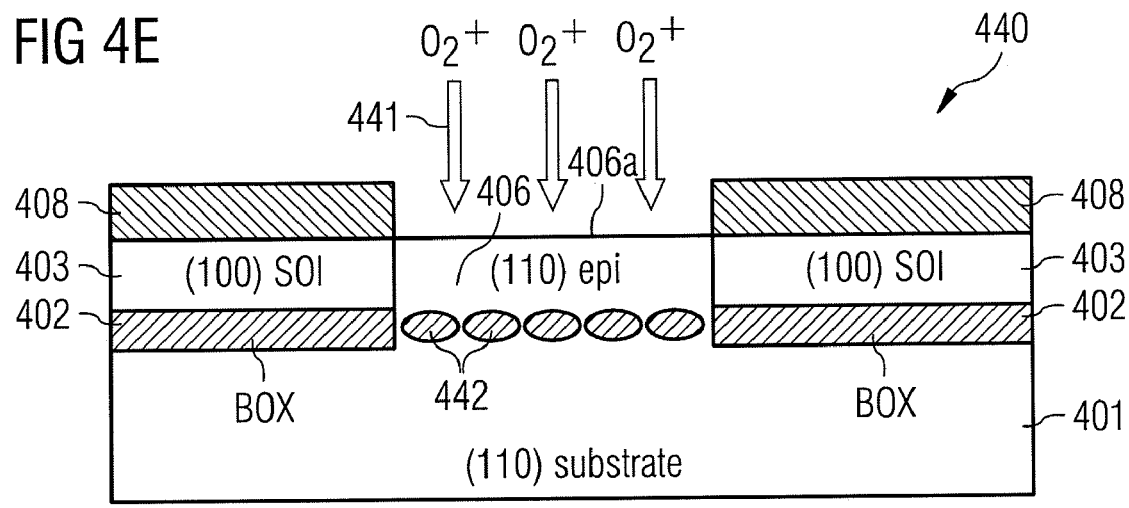
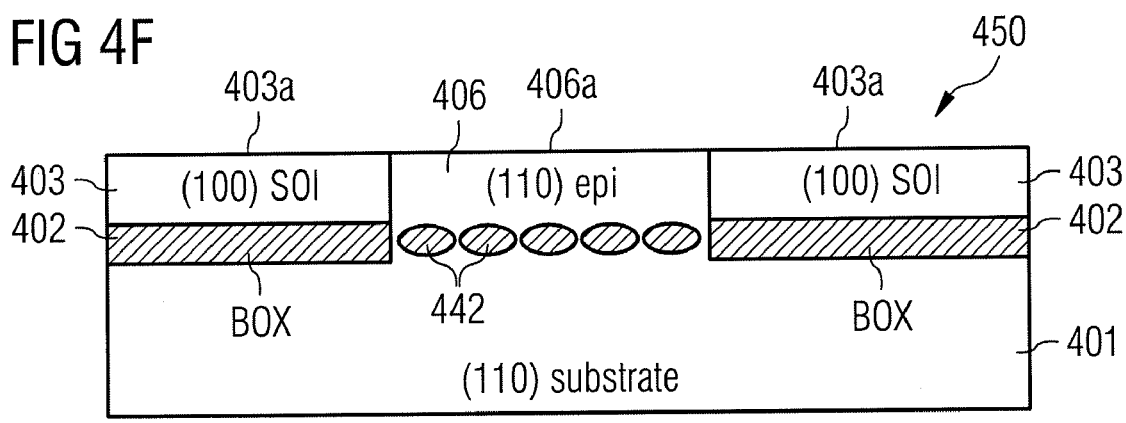

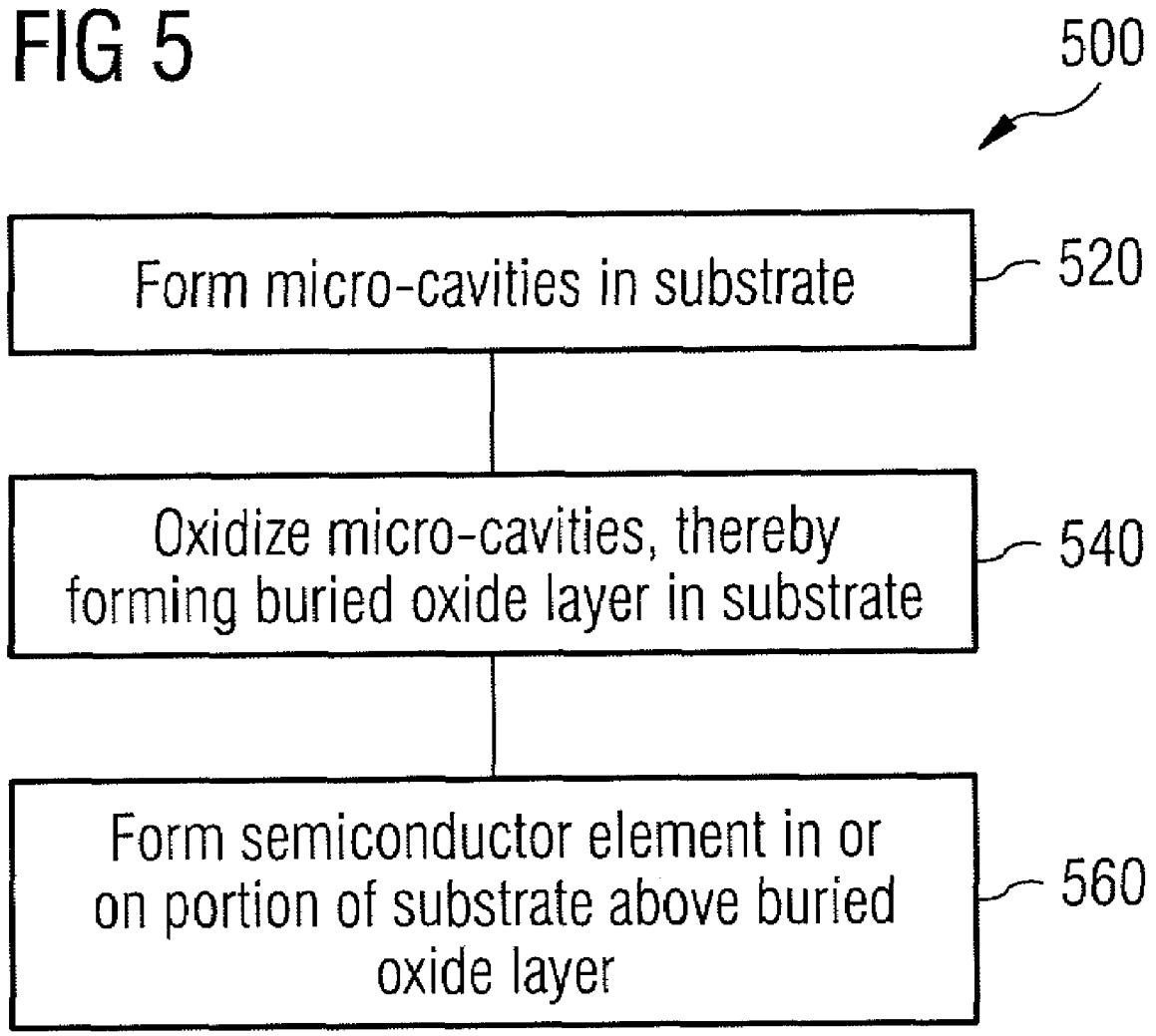

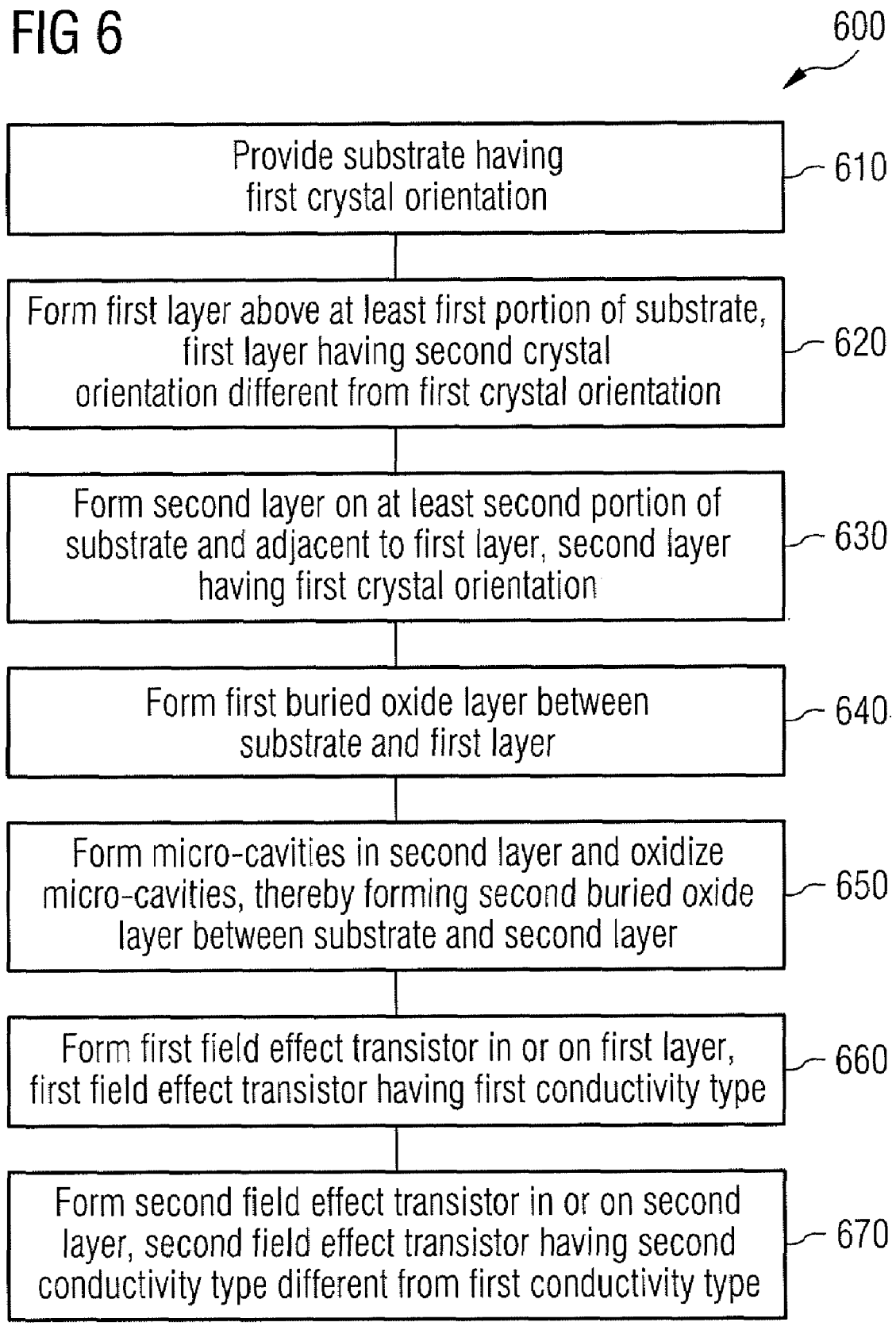

METHOD OF PRODUCING A FIELD EFFECT TRANSISTOR ARRANGEMENT

CROSS-REFERENCE TO RELATED APPLICATION

This application is a divisional of U.S. application Ser. No. 11/678,334, filed Feb. 23, 2007 now abandoned, which is incorporated by reference in its entirety.

BACKGROUND

The present invention relates generally to semiconductor elements and the fabrication thereof.

It is desirable to enhance the performance of CMOS (complementary metal oxide semiconductor) devices.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 3A to 3F show different process stages of a conventional method of producing a CMOS field effect transistor arrangement;

FIGS. 4A to 4I show different process stages of a method of producing a field effect transistor arrangement in accordance with an embodiment of the invention;

FIG. 5 shows a method of producing a semiconductor element in accordance with an embodiment of the invention; and FIG. 6 shows a method of producing a field effect transistor arrangement in accordance with an embodiment of the invention.

DESCRIPTION

Every new technology node in the international technology road map for semiconductors (ITRS) is accompanied by a shrinking of the gate length and the gate oxide thickness in field effect transistors. On the one hand, the reduction of both gate length and gate oxide thickness results in an increase of the transistor performance. On the other hand, however, the thinning of the gate oxide thickness causes a severe increase of the gate current and therefore also a rise of the standby power.

A possibility to reduce the gate leakage would be the introduction of a high-k gate material, that is a gate material having a higher relative permittivity k than that of silicon dioxide. Presently though, high-k gate dielectrics are still in an early stage of development. Therefore the thinning of the gate oxide thickness will slow down for future technology generations as already observed in the 45 nm technology node.

The poly length scaling (i.e., the scaling of the length of a polysilicon gate) has to be reduced as well in order to guarantee the electrical integrity of the transistors and control the short channel effects.

Due to the reduced scaling of both gate oxide thickness and transistor poly length, the required performance increase has to originate from other sources. For example, at the 45 nm technology node the performance increase relies on stress engineering to enhance the charge carrier mobility.

Figure 1:
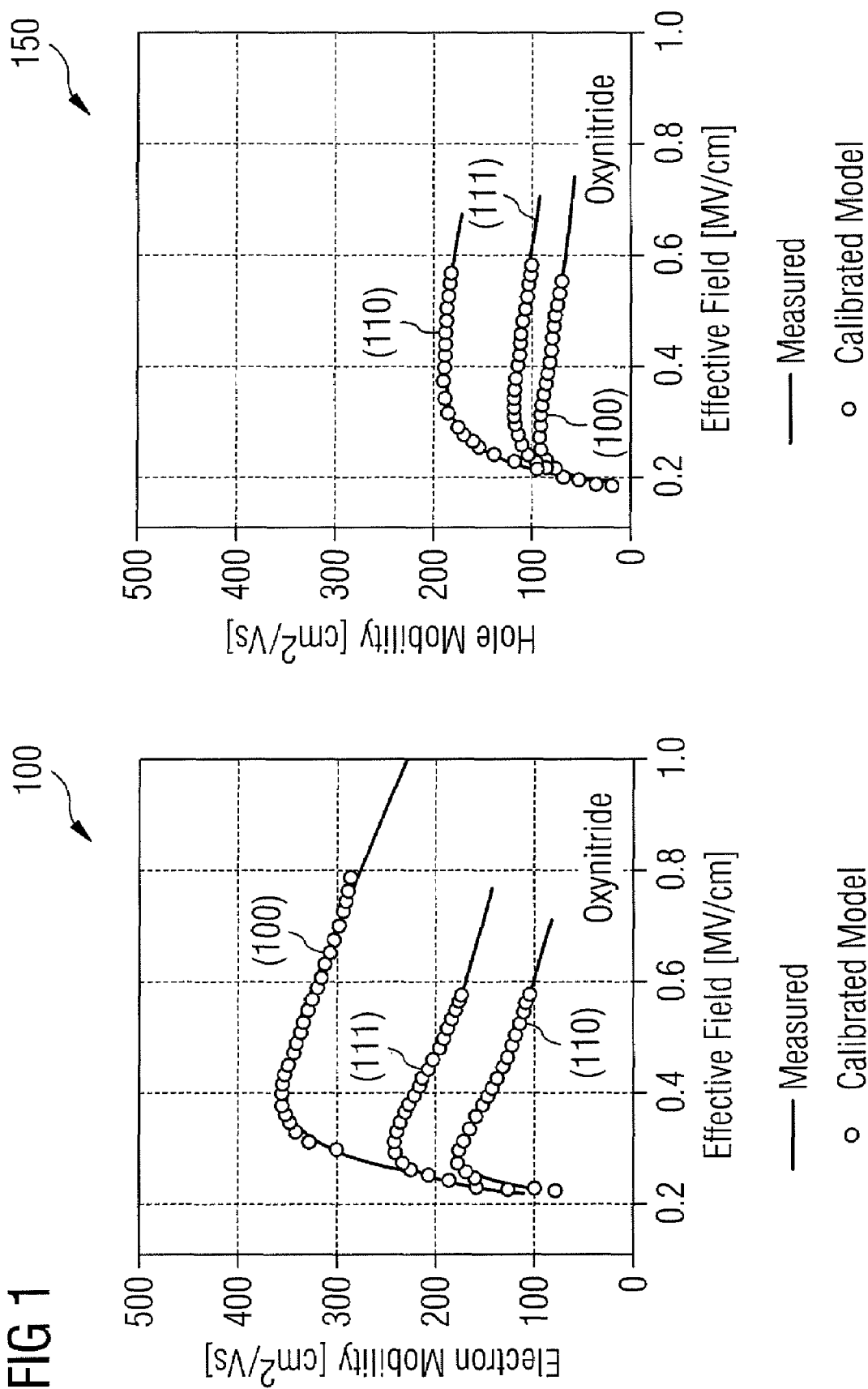
FIG. 1 shows electron and hole mobilities for different surface orientations.

In case that a high-k dielectric is still not available for the 32 nm technology node, the carrier mobility could be further increased by a change of the substrate orientation and keeping the stress engineering techniques. For example, the hole mobility benefits of a (110) surface orientated substrate whereas the electron mobility is maximum at the standard commonly used (100) surface and degrades when a (110) substrate is used, as is shown in FIG. 1 which shows, in a first diagram 100, the electron mobility and, in a second diagram 150, the hole mobility for (100), (110) and (111) surface orientations, in each case plotted versus the effective electric field strength.

Accordingly, the maximum performance of a CMOS circuit would be expected if the NMOS (n-type MOS) elements were formed in or on a (100) surface orientated substrate and the PMOS (p-type MOS) elements were formed in or on a (110) surface orientated substrate. This approach is referred to as hybrid orientated technology (HOT).

The HOT concept uses a silicon-on-insulator (SOI) substrate with a buried (110) substrate (handle wafer) and a (100) top silicon layer. The NMOS is built up in or on the (100) top layer SOI substrate, whereas the PMOS is fabricated in or on a (110) substrate. The (110) substrate results from the epitaxial re-growth of the handle wafer.

Figure 2:
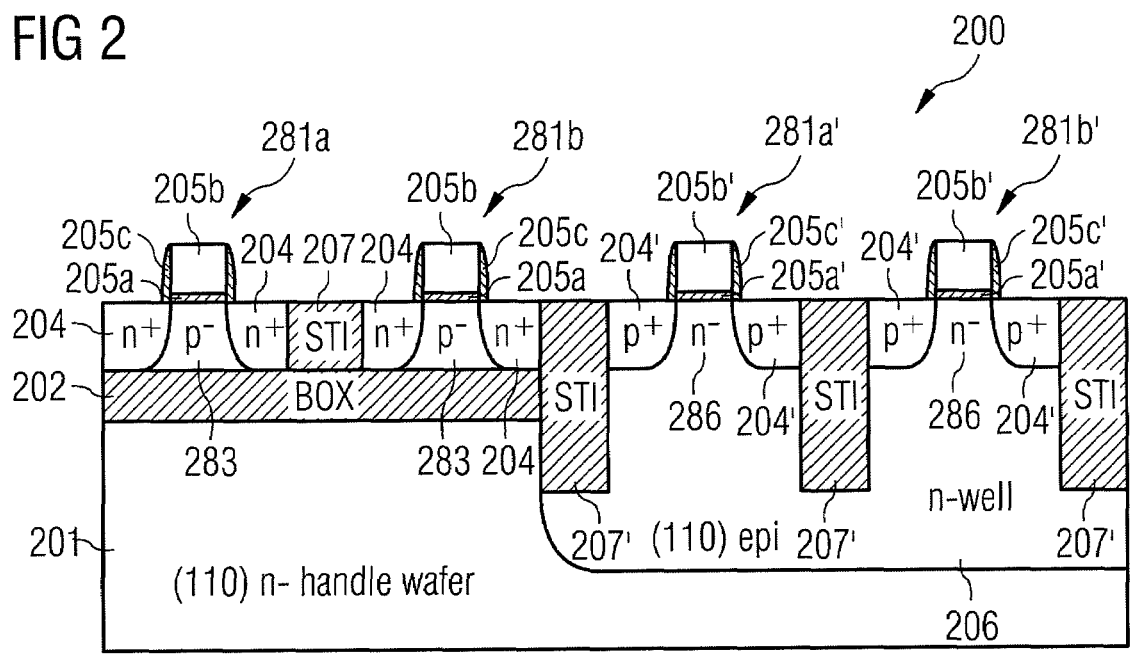
FIG. 2 shows a conventional CMOS structure.

FIG. 2 illustrates schematically a conventional CMOS structure 200 which has been formed in accordance with the conventional HOT approach. The CMOS structure 200 includes a first NMOS transistor 281a and a second NMOS transistor 281b formed in or on a (100) silicon layer (not shown, cf. reference numeral 303 in FIGS. 3A to 3E) and separated from one another by a first shallow trench isolation (STI) structure 207. The NMOS transistors 281a, 281b are formed on a buried oxide layer 202, which is formed on a first portion of an n⁻ doped (110) silicon handle wafer 201. Each of the NMOS field effect transistors 281a, 281b includes n⁺ doped source/drain regions 204 and a p⁻ doped body region 283 formed between the source/drain regions 204. A gate structure is in each case formed on the body region 283, the gate structure including a gate dielectric 205a, a conductive gate layer 205b formed on the gate dielectric 205a, and gate spacers 205c.

The CMOS structure 200 further includes a first PMOS transistor 281a' and a second PMOS transistor 281b' formed in a (110) silicon layer 206, which is formed on a second portion of the (110) handle wafer 201. The (110) layer 206 has been formed by epitaxial regrowth of the (110) handle wafer 201 and clearly serves as an n-well for the PMOS transistors 281a', 281b'. The PMOS transistors 281a', 281b' are separated from one another and from the second NMOS transistor 281b by means of second STI structures 207'. Each of the PMOS field effect transistors 281a', 281b' includes p⁺ doped source/drain regions 204', with an n⁻ doped portion 286 of the n-well 206 in each case being disposed between the highly doped source/drain regions 204'. A gate structure is in each case formed on the n⁻ doped portion 286 of the n-well 206, the gate structure including a gate dielectric 205a', a conductive gate layer 205b' formed on the gate dielectric 205a', and gate spacers 205c'.

In the following, various process stages of a conventional HOT process flow are described in connection with FIGS. 3A to 3F.

FIG. 3A shows a first process stage 300 of the HOT process flow, in which a layer arrangement is formed, the layer arrangement including a (110) silicon (Si) handle wafer 301, a buried oxide (BOX) layer 302 disposed on the (110) silicon handle wafer 301, a (100) silicon layer 303 disposed on the buried oxide layer 302, and an electrically insulating layer 308 disposed on the (100) silicon layer 303. The insulating layer 308 may include an oxide layer and a nitride layer disposed on the oxide layer.

The layer arrangement shown in FIG. 3A clearly is a (100) SOI substrate 302/303 formed on a (110) silicon handle wafer and covered by an insulating layer stack 308. The SOI substrate 302/303 may have been formed, for example, by bonding a (100) silicon wafer to the (110) silicon handle wafer 301 and subsequent deposition of the oxide layer and the nitride layer, thereby forming the insulating layer stack 308.

FIG. 3B shows another process stage 310 of the HOT process flow, in which a portion of the layer stack 302/303/308 including the insulating layer 308, the silicon layer 303 and the buried oxide layer 302 is removed (for example, by means of an etching crosses), thereby exposing a portion of the upper surface 301a of the (110) silicon handle wafer 301, and also exposing sidewalls 328 of the remaining portions of the layer stack 302/303/308. In other words, FIG. 3B shows an SOI/BOX stack etching process. In addition, FIG. 3B shows the formation of spacers 305 on the exposed sidewalls 328 of the remaining portions of the layer stack 302/303/308.

FIG. 3C shows another process stage 320 of the HOT process flow, in which a (110) silicon layer 306 is formed on the exposed portion of the upper surface 301a of the (110) silicon handle wafer 301, such that the area between the spacers 305 is filled by the (110) silicon layer 306. The (110) silicon layer 306 is formed by an epitaxial growth process such as, for example, molecular beam epitaxy (MBE), and the (110) silicon layer 306 may be formed in such a way, that it partially covers the upper surface of the insulating layer 308. By means of a chemical mechanical polishing (CMP) process, that portion of the (110) silicon layer 306 covering the insulating layer 308 may be removed, such that after the CMP the (110) silicon layer 306 and the insulating layer 308 have co-planar surfaces.

Figure 3D:
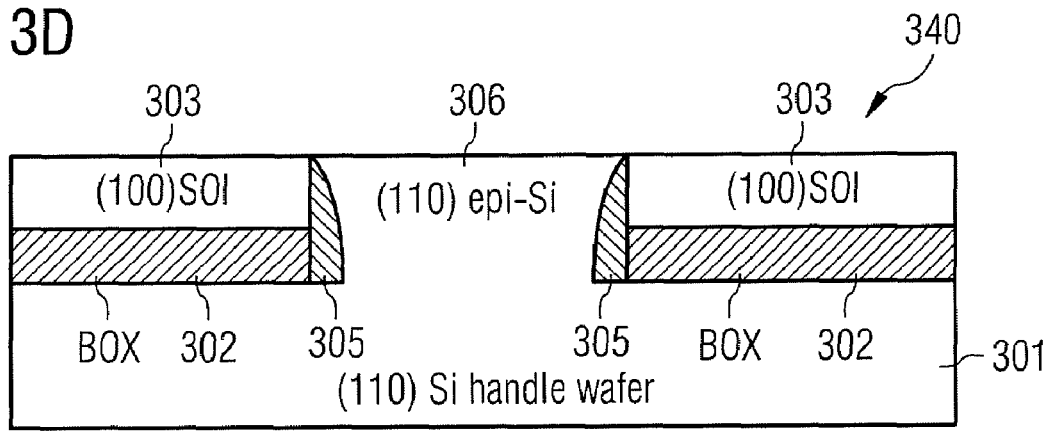

FIG. 3D shows another process stage 340 of the HOT process flow, in which the upper surface of the (100) silicon layer 303 is exposed by removing the insulating layer 308. In other words, the thin oxide and nitride layers of the insulating layer are stripped. In addition, the (110) silicon layer 306 is etched back, such that its upper surface is co-planar with the exposed upper surface of the (100) silicon layer 303.

Figure 3E:
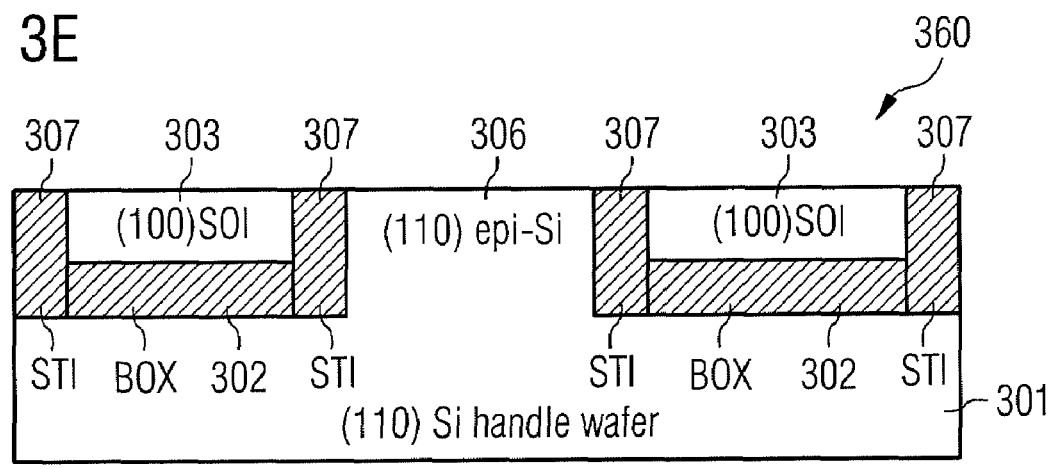

FIG. 3E shows another process stage 360 of the HOT process flow, in which shallow trench isolation (STI) structures 307 are formed in order to laterally insulate the (110) silicon layer 306 and portions of the (100) silicon layer 303 from one another. By means of the STI structures 307, active areas may be defined.

Figure 3F:
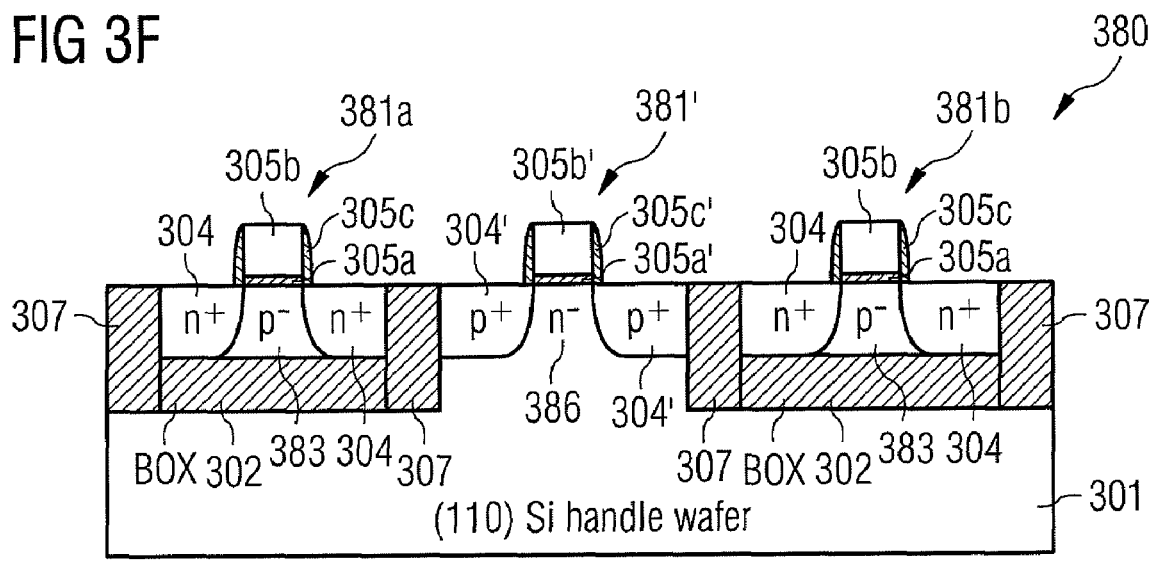

FIG. 3F shows another process stage 380 of the HOT process flow, in which a first NMOS transistor 381a and a second NMOS transistor 381b are formed in or on the insulated portions of the (100) silicon layer 303, and a PMOS transistor 381' is formed in or on the (110) silicon layer 306. The first NMOS transistor 381a and the second NMOS transistor 381b each include $n^+$ doped source/drain regions 304, a $p^-$ doped body region 383 and a gate stack formed on the body region 383, the gate stack including a gate dielectric 305a, a conductive gate layer 305b formed on the gate dielectric 305a, and gate spacers 305c. The PMOS transistor 381' includes $p^+$ doped source/drain regions 304', an $n^-$ doped well region 386 and a gate stack disposed on the well region 386, the gate stack including a gate dielectric 305a', a conductive gate layer 305b' formed on the gate dielectric 305a', and gate spacers 305c'.

As can be seen in FIG. 3F, the HOT fabrication process results in two partially depleted (PD) SOI NMOS transistors 381a, 381b formed in or on a (100) SOI substrate, and a bulk PMOS transistor 381' formed in or on a (110) substrate. In other words, the NMOS transistors 381a, 381b are fabricated on PDSOI whereas the PMOS transistor 381' is a conventional bulk device.

The mixing of a PDSOI device with a bulk device in the conventional HOT concept increases the design effort. The PDSOI transistor suffers from a floating body and therefore from the well-known history effect, that is the dependence of the threshold voltage of the transistor on the previous states of the transistor. This peculiar PDSOI feature has to be addressed during modeling and simulation. Furthermore, the characteristic of the NMOS transistor is affected by self-heating which also has to be addressed during modeling development. On the other hand, the NMOS transistor may benefit from the reduced junction capacitance of an SOI transistor which may improve the dynamic performance. The PMOS device, however, is a standard bulk device without floating body effect, self-heating and reduced junction capacitance, and thus has significantly different device characteristics.

The different device characteristics of the NMOS and PMOS transistors in the conventional HOT architecture complicate the circuit design. In addition, the HOT concept cannot fully benefit from the improvements of the SOI technology.

A field effect transistor arrangement in accordance with an embodiment of the invention includes a substrate having a first crystal surface orientation; a first layer formed above at least a first portion of the substrate and having a second crystal surface orientation different from the first crystal surface orientation; a second layer formed above at least a second portion of the substrate and adjacent to the first layer, the second layer having the first crystal surface orientation; a first buried oxide layer formed between the first layer and the substrate; a second buried oxide layer formed between the second layer and the substrate; a first field effect transistor formed in or on the first layer, the first field effect transistor having a first conductivity type; a second field effect transistor formed in or on the second layer, the second field effect transistor having a second conductivity type different from the first conductivity type.

A method of producing a field effect transistor arrangement in accordance with another embodiment of the invention includes providing a substrate having a first crystal surface orientation; forming a first layer above at least a first portion of the substrate, the first layer having a second crystal surface orientation different from the first crystal surface orientation; forming a second layer on at least a second portion of the substrate and adjacent to the first layer, the second layer having the first crystal surface orientation; forming a first buried oxide layer between the substrate and the first layer; forming micro-cavities in the second layer and oxidizing the micro-cavities, thereby forming a second buried oxide layer between the substrate and the second layer; forming a first field effect transistor in or on the first layer, the first field effect transistor having a first conductivity type; and forming a second field effect transistor in or on the second layer, the second field effect transistor having a second conductivity type.

A method of producing a semiconductor element in accordance with another embodiment of the invention includes forming micro-cavities in a substrate; oxidizing the micro-cavities, thereby forming a buried oxide layer in the substrate;

and forming the semiconductor element in or on a portion of the substrate above the buried oxide layer.

A semiconductor element in accordance with another embodiment of the invention includes a substrate; a buried oxide layer formed in the substrate, wherein the buried oxide layer is formed by means of forming micro-cavities in the substrate and oxidizing the micro-cavities.

In accordance with another embodiment of the invention, the substrate is a silicon substrate. That is, the substrate may include silicon material or may be made of silicon material.

In one embodiment of the invention, the first layer and/or the second layer include/includes silicon. In another embodiment of the invention, the first layer and/or the second layer are/is made of silicon.

According to other embodiments of the invention, the substrate and/or the first layer and/or the second layer may include or may be made of other materials or material systems, such as, for example III-V materials. In accordance with another embodiment, the semiconductor element may have a heterostructure such as, for example, a SiGe layer formed on a silicon layer, or a strained silicon layer formed (e.g., deposited) on a SiGe/Si substrate.

In accordance with another embodiment of the invention, the first crystal surface orientation is a (110) crystal surface orientation and the second crystal surface orientation is a (100) crystal surface orientation. Alternatively, the first crystal orientation may be a (111) crystal orientation. The terms "crystal surface orientation", "surface orientation" and "crystal orientation" are used interchangeably hereinafter and refer to the surface orientation of a crystalline layer or layer arrangement (e.g. wafer). For example, the term (100) wafer refers to a wafer whose main processing surface has a (100) orientation.

In accordance with another embodiment of the invention, the substrate is a wafer, for example a silicon handle wafer, e.g. a (110) silicon handle wafer (that is, a silicon handle wafer having a (110) orientation of its main processing surface).

In accordance with another embodiment of the invention, the first field effect transistor includes a first source/drain region and a second source/drain region formed in the first layer, and a body region formed in the first layer between the first source/drain region and the second source/drain region.

In accordance with another embodiment of the invention, the second field effect transistor includes a first source/drain region and a second source/drain region formed in the second layer, and a body region formed in the second layer between the first source/drain region and the second source/drain region. The source/drain regions may be highly doped, and the body region may be lowly doped, in accordance with an embodiment.

In accordance with another embodiment of the invention, the first field effect transistor and/or the second field effect transistor include/includes a gate structure or gate stack formed on the body region. The gate stack may include a gate dielectric layer formed on the body region and a conductive gate layer formed on the gate dielectric layer. The gate dielectric layer may include a suitable dielectric material such as, e.g., silicon dioxide, and the conductive gate layer may include a suitable gate material such as, e.g., polysilicon. The gate stack may furthermore include one or more gate spacers (e.g. nitride spacers), formed at one or more sidewalls of the gate stack, for example.

In accordance with another embodiment of the invention, the first field effect transistor is an NMOS field effect transistor (that is, a metal oxide semiconductor (MOS) field effect transistor having n-type conductivity), and the second field effect transistor is a PMOS field effect transistor (that is, a MOS field effect transistor having p-type conductivity). In other words, a CMOS field effect transistor arrangement may be provided in accordance with this embodiment.

In accordance with another embodiment of the invention, at least one of the source/drain regions of the first field effect transistor may be highly doped, for example highly n-doped (e.g. $n^+$ doped) in case of the first field effect transistor being an NMOS field effect transistor. In addition, the body region of the first field effect transistor may be lowly doped, for example lowly p-doped (e.g. $p^-$ doped) in accordance with an embodiment.

In accordance with another embodiment of the invention, at least one of the source/drain regions of the second field effect transistor may be highly doped, for example highly p-doped (e.g. $p^+$ doped) in case of the second field effect transistor being a PMOS field effect transistor. In addition, the body region of the second field effect transistor may be lowly doped, for example lowly n-doped (e.g. $n^-$ doped) in accordance with an embodiment.

In accordance with another embodiment of the invention, the second layer is formed by means of an epitaxial growth process. In other words, the second layer may be grown as an epitaxial layer on the second portion of the substrate, for example using a molecular beam epitaxy (MBE) growth process, alternatively using any other suitable epitaxial growth process.

In accordance with another embodiment of the invention, light ions are implanted into the substrate, thereby forming the micro-cavities in the substrate. The term "light ions" as used herein refers to ions having a low mass or small mass number.

In accordance with another embodiment of the invention, the light ions are selected from a group of ions consisting of: hydrogen ions ($H_2^+$ ions), helium ions ($He^+$ ions), fluorine ions ($F^+$ ions), neon ions ($Ne^+$ ions), chlorine ions ($Cl^+$ ions), argon ions ($Ar^+$ ions).

In accordance with another embodiment of the invention, the light ions are implanted with an implantation dose of approximately between $10^{15}$ cm$^{-2}$ and $10^{18}$ cm$^{-2}$.

In accordance with another embodiment of the invention, the light ions have an implantation energy of approximately between 10 keV and 150 keV.

Clearly, by means of choosing the implantation dose and/or energy of the light ions, the depth and the extent of the region in which the micro-cavities are formed later can be influenced. In this context, the term "depth" refers to the distance from the substrate surface (in general, from the surface of the region in which the light ions are implanted into), and the term "extent" refers to the extent in the direction of the normal to the surface, for example, the extent in the [100] direction in case of a (100) substrate.

In accordance with another embodiment of the invention, micro-platelets (that is to say, platelet-like defects in the crystal structure) are formed by the implantation of the light ions, and the micro-cavities are formed from the micro-platelets, for example, by means of a heat treatment.

In accordance with another embodiment of the invention, after formation of the micro-cavities and before oxidation of the micro-cavities, oxygen ions (e.g., $O_2^+$ ions) are implanted into the substrate, thereby forming oxygen-rich precipitates in the substrate, for example forming $SiO_2$ precipitates in a silicon substrate in accordance with an embodiment. By means of the $O_2^+$ implant a huge super-saturation of oxygen molecules may be introduced or formed close to the micro-cavities, and a continuous BOX layer may then be formed by the coalescence of close-spaced oxygen precipitates upon an internal oxidation process, in accordance with an embodiment of the invention.

In accordance with one embodiment of the invention, the oxygen ions are implanted with an implantation dose of approximately between $10^{15}$ cm$^{-2}$ and $10^{18}$ cm$^{-2}$.

In accordance with another embodiment of the invention, the oxygen ions have an implantation energy of approximately between 10 keV and 400 keV.

In accordance with another embodiment of the invention, the micro-cavities are oxidized by means of a high-temperature treatment (high-temperature anneal) and introducing oxygen into the micro-cavities.

In accordance with another embodiment of the invention, the substrate is heated to a temperature of approximately between 1000° C. and 1350° C. in the context of the high-temperature treatment.

In accordance with another embodiment of the invention, the substrate is heated for a duration of approximately between 30 min and 2 h in the context of the high-temperature treatment.

In accordance with another embodiment of the invention, the oxygen is introduced into the micro-cavities by means of thermal indiffusion or implantation.

In accordance with another embodiment of the invention, the second buried oxide layer is formed by means of forming micro-cavities in the second layer and oxidizing the micro-cavities. The micro-cavities may be formed and/or oxidized, for example, in accordance with one of the embodiments described herein.

In accordance with another embodiment of the invention, the first layer having the second crystal surface orientation (e.g., a (100) surface orientation) and the first buried oxide layer are formed by bonding a second wafer having the second crystal surface orientation (for example, a (100) silicon wafer) to the substrate (for example, to a (110) silicon handle wafer) using, for example, well-known wafer bonding techniques. In this way, a silicon-on-insulator (SOI) substrate may be formed, including a top (100) silicon layer, a (110) substrate and a buried oxide layer between the (110) substrate and the top (100) silicon layer.

In accordance with another embodiment of the invention, at least one shallow trench isolation (STI) element is formed between the first layer and the second layer. By means of the STI element or structure, the first and second layer, and thus the first and second field effect transistor, may be laterally electrically insulated from one another. The STI element may be formed, for example, using conventional lithographical or etching techniques.

In the following, various process stages of a method of producing a field effect transistor arrangement in accordance with an embodiment of the invention are described in connection with FIGS. 4A to 4I.

In one process stage 400 of the method, illustrated in FIG. 4A, a substrate 401 having a first crystal surface orientation is provided. In accordance with the embodiment shown in FIG. 4A, the substrate 401 is a (110) silicon wafer (e.g., handle wafer), that is a silicon wafer wafer having a (110) surface orientation. A first layer 403 is formed above the substrate 401, the first layer having a second crystal surface orientation different from the first crystal surface orientation (that is, the crystal surface orientation of the substrate 401). In accordance with the embodiment shown, the first layer 403 is a silicon layer having a (100) surface orientation. A first buried oxide (BOX) layer 402 is formed between the substrate 401 and the first layer 403. The layer arrangement 401/402/403 may be formed, for example, by bonding a (100) silicon wafer to the (110) silicon handle wafer 401, thereby clearly forming a (100) silicon-on-insulator (SOI) layer on a (110) handle wafer with a BOX layer (first buried oxide layer 402) disposed between the (110) handle wafer (substrate 401) and a (100) silicon top layer (first layer 403). The wafer-bonding may be carried out, for example, by using suitable wafer-bonding techniques. In another process stage shown in FIG. 4A, an insulating layer 408 is formed on the (100) silicon top layer (that is, on the upper surface of the first layer 403). In accordance with an embodiment, the insulating layer 408 may include a thin oxide layer and/or a thin nitride layer disposed on the oxide layer, for example. The insulating layer 408 may be formed, for example, by suitable deposition techniques such as, for example, chemical vapor deposition (CVD).

In another process stage 410 of the method, illustrated in FIG. 4B, a central portion of the layer arrangement or layer stack 402/403/408 is removed, such that a portion of the upper surface 401a of the substrate 401 is exposed and that also sidewalls 428 of the remaining portions of the layer stack 402/403/408 are exposed. The removal of the material of the first buried oxide layer 402, the first layer 403 and the insulating layer 408 may be carried out by using suitable lithographical and/or etching techniques, for example an anisotropic etching process. In other words, FIG. 4B shows an SOF/BOX stack etching process, in which a portion of the layer stack 402/403/408 including the first buried oxide layer 402, the first layer 403, and the insulating layer 408 is etched back down to the upper surface 401a of the (110) silicon handle wafer 401, thereby clearly forming a trench 409 with the exposed portion of the upper surface 401a of the substrate 401 forming the bottom of the trench and the exposed sidewalls 428 of the remaining portions of the layer stack 402/403/408 forming the sidewalls of the trench 409.

In another process stage 420 of the method, illustrated in FIG. 4C, a second layer 406 is formed on the exposed portion of the upper surface 401a of the substrate 401, the second layer 406 having the first crystal surface orientation, that is the same crystal orientation as the substrate 401, i.e. a (110) surface orientation in accordance with this embodiment. In accordance with the embodiment shown, the second layer 406 is a (110) silicon layer which is grown epitaxially on the exposed portion of the upper surface 401a of the substrate 401. In other words, the second layer 406 is formed by means of an epitaxial growth process, for example by means of molecular beam epitaxy (MBE).

In the embodiment shown in FIG. 4C, the second layer 406 is formed in such a way that the trench 409 is not completely filled with material of the second 406. In other words, the upper surface 406a of the second layer 406 is lower than the upper surface of the insulating layer 408. As is shown, the upper surfaces of the first layer 403 and the second layer 406 are co-planar.

In an alternative embodiment, the second layer 406 may be grown in such a way, that it at least partially covers the insulating layer 408. In this case, after the epitaxial growth of the second layer 406, those portions of the second layer 406, which cover the insulating layer 408, may be removed using, for example, a chemical mechanical polishing (CMP) method, such that the upper surfaces of the second layer 406 and the insulating layer 408 become flush. In addition, an upper portion of the second layer 406 may optionally be removed, for example etched back, in accordance with another embodiment.

The second layer 406 is formed between those portions of the buried oxide layer 402 and the first layer 403, which have remained after the etching described above in connection with FIG. 4B. Clearly, the second layer 406 partially fills the trench 409 formed previously by the etching. In the embodiment shown in FIG. 4C, the second layer 406 is adjacent to the remaining portions of the first layer 403. In alternative embodiments, spacers (for example nitride spacers) may be formed at the sidewalls 428 of the remaining portions of the layer stack 402/403/408, that is clearly at the inner walls of the trench 409, and the second layer 406 may in this case be separated from the first layer 403 by the spacers (not shown in FIG. 4C, compare spacers 305 in FIG. 3C).

In another process stage 430 of the method, illustrated in FIG. 4D, micro-cavities 432 are formed in the second layer 406. In accordance with the embodiment shown, the micro-cavities 432 are formed by means of implanting hydrogen ions ($H_2^+$ ions), designated by the arrows 431 in FIG. 4D, into the second layer 406. In alternative embodiments, other light ions may be used in addition or instead of hydrogen ions during the implantation. According to an embodiment, the hydrogen ions 431 may be implanted with an implantation dose of approximately between $10^{15}$ cm$^{-2}$ and $10^{18}$ cm$^{-2}$, and the hydrogen ions 431 may have an implantation energy of approximately between 10 keV and 150 keV, in accordance with another embodiment. The insulation layer 408 may serve the purpose of an implantation mask during the hydrogen ion implantation 431, in that the insulating layer may prevent the implantation of hydrogen 431 ions into the first layer 403 (that is, the (100) silicon layer 403). By means of the implantation dose and/or energy, the concentration maximum of the implanted hydrogen ions 431 (in general, of the implanted light ions) may be controlled, and in this way the depth and/or extent of the region in which the micro-cavities 432 are formed in the second layer 406 may be influenced.

As is shown in FIG. 4D, the implantation dose and/or energy of the hydrogen ions 431 (in general, of the light ions) may, for example, be chosen in such a way that the depth, in which the micro-cavities 432 are formed in the second layer 406, corresponds or is approximately equal to the depth of the first buried oxide layer 402. Thus, a second buried oxide layer 461, which is formed subsequently using the micro-cavities 432 may be formed in the same or approximately the same depth as the first buried oxide layer 402, in accordance with an embodiment of the invention.

In another process stage 440 of the method, illustrated in FIG. 4E, oxygen ions ($O_2^+$ ions), designated by the arrows 441 in FIG. 4E, are implanted into the second layer 406, thereby forming oxygen-rich precipitates 442 in the second layer 406 from the micro-cavities 432. The oxygen ions 441 may be implanted, for example, with an implantation dose of approximately between $10^{15}$ cm$^{-2}$ and $10^{18}$ cm$^{-2}$, and the oxygen ions 441 may have an implantation energy of approximately between 10 keV and 400 keV, in accordance with certain embodiments of the invention. The insulation layer 408 may serve the purpose of an implantation mask during the oxygen ion implantation 441, in that the insulating layer 408 may prevent the implantation of oxygen ions 441 into the first layer 403 (that is, the (100) silicon layer 403).

By means of the $O_2^+$ implant 441, a huge super-saturation of oxygen molecules is introduced close to the micro-cavities 432, and clearly, a band of close-spaced silicon dioxide ($SiO_2$) precipitates 442 is formed in the second layer 406. According to the embodiment shown in FIG. 4E, the depth of the band of $SiO_2$ precipitates 442 within the second layer 406 is the same or approximately the same as the depth of the first buried oxide layer 402.

In another process stage 450 of the method, illustrated in FIG. 4F, the remaining portions of the insulating layer 408 are removed. In other words, the thin nitride and/or oxide layer are/is stripped off, for example using conventional techniques. In this way, the layer arrangement shown in FIG. 4F is obtained, with the epitaxial (110) silicon layer 406 (that is, the second layer 406) having a co-planar or substantially co-planar upper surface 406a with the upper surface 403a of the remaining portions of the (100) silicon layer 403 (that is, the first layer 403).

Figure 4G:
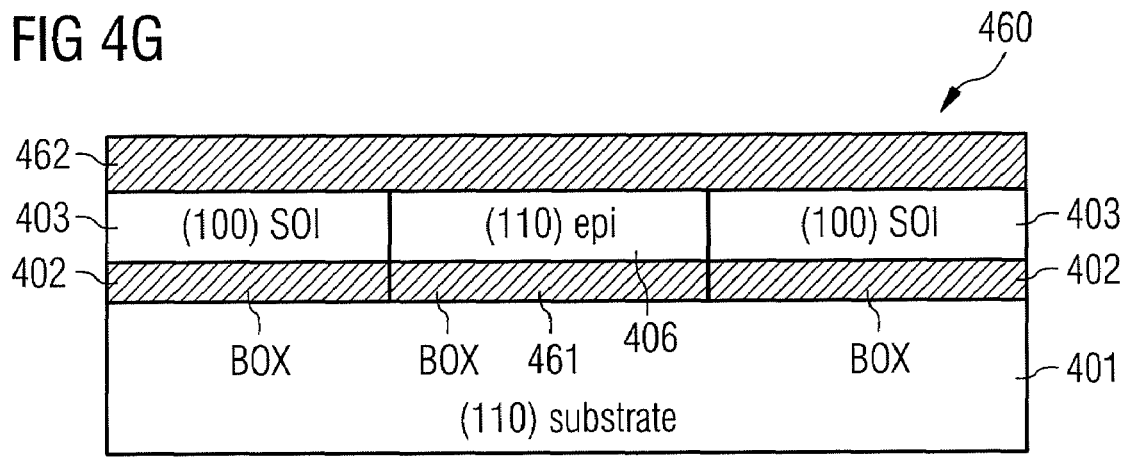

In another process stage 460 of the method, illustrated in FIG. 4G, the micro-cavities 432 (more precisely, the $SiO_2$ precipitates 442) are oxidized, thereby forming a second buried oxide layer 461 between the substrate 401 and the second layer 406. In accordance with an embodiment, the oxidation of the micro-cavities 432 may be carried out by means of a high-temperature treatment and introducing oxygen into the micro-cavities 432. The high-temperature treatment can be carried out, for example, in such a way that the substrate is heated to a temperature of approximately between 1000° C. and 1350° C. during the high-temperature treatment. According to another embodiment, the substrate may be heated for a duration of approximately between 30 minutes and 2 hours in the context of the high-temperature treatment. According to another embodiment, the oxygen may be introduced into the micro-cavities 432 by means of thermal indiffusion or implantation. By means of the oxidation of the micro-cavities 432, a continuous second buried oxide layer 461 is formed between the remaining portions of the first buried oxide layer 402, as can be seen in FIG. 4G. In other words, by means of the second buried oxide layer 461 the second layer 406 is electrically insulated from the substrate 401 below. The second buried oxide layer 461 is clearly formed by the coalescence of close-spaced silicon dioxide precipitates 442 during the internal oxidation (ITOX) process. In addition to the formation of the second buried oxide layer 461, according to the embodiment shown in FIG. 4G, a thermal oxide layer 462 is formed on the first layer 403 and on the second layer 406 during the oxidation process.

Figure 4H:
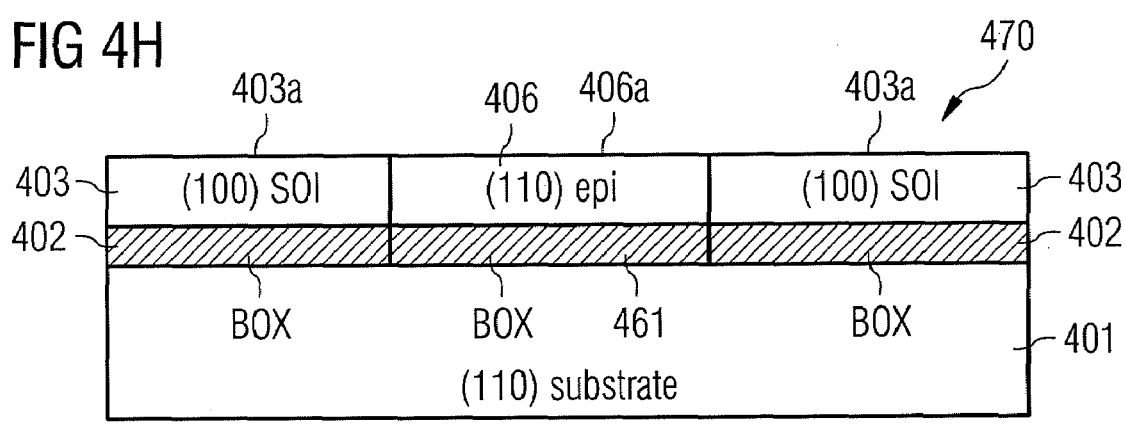

In another process stage 470 of the method, illustrated in FIG. 4H, the thermal oxide layer 462 is removed, for example by using conventional etching techniques, thereby exposing the upper surfaces 403a, 406a of the first layer 403 and the second layer 406. Clearly, the layer structure shown in FIG. 4H is an SOI substrate having silicon top layers 403, 406 with different surface orientations formed on first and second buried oxide layers 402, 461, respectively. That is, a first portion of the SOI substrate includes a (100) silicon top layer (that is, the first layer 403) formed on a first buried oxide layer 402, and a second portion of the SOI substrate includes a (110) silicon top layer (that is, the second layer 406) formed on a second buried oxide layer 461.

Figure 4I:
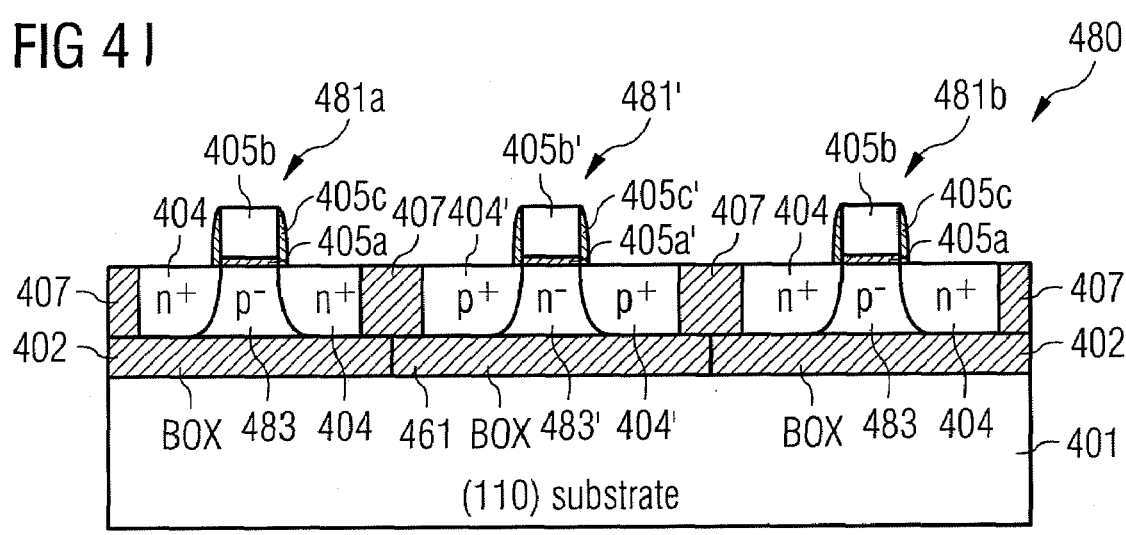

In another process stage 480 of the method, illustrated in FIG. 4I, a first NMOS transistor 481a and a second NMOS transistor 481b are formed in or on the first layer 403 (that is, in or on the (100) silicon top layer), and a PMOS transistor 481' is formed in or on the second layer 406 (that is, in or on the (110) silicon top layer). The NMOS and PMOS transistors 481a, 481b, 481' are electrically insulated from one another in lateral direction by shallow trench isolations 407 formed between adjacent transistors. The shallow trench isolations 407 may serve to define active areas for the transistors 481a, 481b, 481'.

Each one of the NMOS transistors 481a, 481b includes highly n-doped (n$^+$ doped) source/drain regions 404, a lowly p-doped (p$^-$ doped) body region 483 formed between the source/drain regions 404, as well as a gate structure formed on the body region 483, the gate structure including a gate dielectric layer 405a, a conductive gate layer 405b formed on the gate dielectric layer 405a, and gate spacers 405c.

Similarly, the PMOS transistor 481' includes highly p-doped (p$^+$ doped) source/drain regions 404', a lowly n-doped (n$^-$ doped) body region 483' formed between the source/drain regions 404', as well as a gate structure formed on the body region 483', the gate structure including a gate dielectric layer 405a', a conductive gate layer 405b' formed on the gate dielectric 405a', as well as gate spacers 405c'.

The formation of the NMOS transistors 481a, 481b, the PMOS transistor 481' as well as the electrically insulating STI elements 407 may be carried out by using, for example, suitable processes of a conventional CMOS process flow. For example, the STI structures 407 can be formed by trench etching in combination with oxide deposition. Alternatively, the shallow trench isolation structures 407 can be formed by any other suitable technique.

The first NMOS transistor 481a and/or the second NMOS transistor 481b may be formed, for example, by performing a p-well implantation (for example, using boron ions as implant species), forming a gate structure or gate stack on the first layer 403, and performing a source/drain implantation using the gate stack as an implantation mask, thereby forming highly n-doped source/drain regions 404, while a lowly p-doped body region 483 remains under the gate structure. The source/drain implantation can be carried out, for example, by using arsenic or phosphorus as implantation or doping species. The gate structure may be formed by a known method, for example, in that the upper surface 403a of the first layer 403 is oxidized and a polysilicon layer is formed thereon. By means of patterning the polysilicon layer and the silicon dioxide layer, the gate structure with a gate oxide 405a and a gate electrode 405b made of poly silicon is formed. In addition sidewall spacers 405c may be formed at the sidewalls of the gate structure, the sidewall spacers 405c being formed as nitride spacers, for example. The PMOS transistor 481' may be formed in or on the second layer 406 by using equivalent processes as described above in connection with the formation of the NMOS transistors 481a, 481b, wherein in particular arsenic or phosphorous may be used as n-type implantation species for the lowly n-doped body region 483' and boron may be used as p-type implantation species for the highly p-doped source/drain regions 404'.

Clearly, FIG. 4I shows a CMOS field effect transistor arrangement in accordance with one embodiment of the invention, including a first NMOS transistor 481a and a second NMOS transistor 481b, as well as a PMOS transistor 481', wherein the two NMOS transistors 481a, 481b are each formed in or on a (100) silicon layer 403, and the PMOS transistor 481' is formed in or on a (110) silicon layer 406. The NMOS and PMOS transistors 481a, 481b, 481' are laterally electrically insulated from one another by shallow trench isolation structures 407, and both the two NMOS transistors 481a, 481b and the PMOS transistor 481' are electrically insulated from the substrate 401 by respective first and second buried oxide layers 402, 461. In other words, the first NMOS transistor 481a and the second NMOS transistor 481b are electrically insulated from the substrate by the first buried oxide layer 402, and the PMOS transistor 481' is electrically insulated from the substrate 401 by the second buried oxide layer 461.

The second buried oxide layer 461 may have been formed by an internal oxidation of micro-cavities which have been formed in the (110) silicon layer 406, for example by means of light ion implantation, as described above. Clearly in the CMOS structure shown in FIG. 4I, both the NMOS transistors 481a, 481b and the PMOS transistor 481' are formed in or on an SOI substrate. In other words, both the NMOS and the PMOS are formed in an SOI technology, in contrast to the conventional CMOS structure shown in FIG. 3F, where only the NMOS transistors 381a, 381b are based on SOI technology whereas the PMOS 381' is a conventional bulk device.

FIG. 5 shows a method 500 of producing a semiconductor element in accordance with an embodiment of the invention.

In 520, microcavities are formed in a substrate. The microcavities may be formed, for example, in accordance with one of the embodiments described herein.

In 540, the microcavities are oxidized, whereby a buried oxide layer is formed in the substrate. The oxidation of the microcavities may be carried out, for example, in accordance with one of the embodiments described herein.

In 560, a semiconductor element is formed in or on a portion of the substrate above the buried oxide layer. The semiconductor element may be formed in accordance with one of the embodiments described herein.

FIG. 6 shows a method 600 of producing a field effect transistor arrangement in accordance with an embodiment of the invention.

In 610, a substrate is provided, the substrate having a first crystal surface orientation.

In 620, a first layer is formed above at least a first portion of the substrate, the first layer having a second crystal orientation different from the first crystal surface orientation. The first layer may be formed, for example, in accordance with one of the embodiments described herein.

In 630, a second layer is formed on at least a second portion of the substrate and adjacent to the first layer, the second layer having the first crystal orientation. The second layer may be formed, for example, in accordance with one of the embodiments described herein.

In 640, a first buried oxide layer is formed between the substrate and the first layer. The first buried oxide layer may be formed, for example, in accordance with one of the embodiments described herein.

In 650, micro-cavities are formed in the second layer, and the micro-cavities are oxidized, thereby forming a second buried oxide layer between the substrate and the second layer. The micro-cavities may be formed and/or oxidized, for example, in accordance with one of the embodiments described herein.

In 660, a first field effect transistor is formed in or on the first layer, the first field effect transistor having a first conductivity type. The first field effect transistor may be formed, for example, in accordance with one of the embodiments described herein.

In 670, a second field effect transistor is formed in or on the second layer, the second field effect transistor having a second conductivity type different from the first conductivity type. The second field effect transistor may be formed, for example, in accordance with one of the embodiments described herein.

In addition to the foregoing detailed description of exemplary embodiments, further features and effects of certain embodiments of the invention are pointed out in the following.

In accordance with one embodiment of the invention, a CMOS field effect transistor arrangement including an NMOS transistor and a PMOS transistor is provided, with both the NMOS transistor and the PMOS transistor formed in or on an SOI substrate, and with the substrate, in or on which the NMOS transistor is formed, having a different surface orientation (e.g., a (100) orientation) than the surface orientation (e.g., a (110) orientation) of the substrate, in or on which the PMOS transistor is formed.

In accordance with another embodiment of the invention, internal oxidation of micro-cavities is applied to form a $SiO_2$ isolation of a PFET or PMOS in a CMOS structure having different substrate orientations for the NMOS and the PMOS, thereby further improving the performance optimal CMOS structure. In other words, a buried oxide layer (BOX layer) may be formed below a PFET active area by means of internal oxidation of previously formed micro-cavities.

In accordance with another embodiment of the invention, the isolation of the PMOS allows for taking fall benefit of the SOI characteristic of reduced junction capacitance and performance increase due to the kink effect. Additionally, the PMOS is isolated from the substrate which may be beneficial for SoC (system on chip) applications.

One effect of certain embodiments of the invention is that well leakage paths are suppressed and well breakdown voltages are increased which allows for a denser cell layout.

In accordance with another embodiment of the invention, the performance of the PMOS transistor in a CMOS structure is increased, which results in a better ratio of the saturation current of NMOS and PMOS which may, for example, result in an area reduction for logic elements.

In accordance with another embodiment of the invention, a highly optimized CMOS structure is provided, in which both NMOS and PMOS benefit from the advantage of the SOI technology, and in which an additional PMOS boost results from an optimal crystal orientation for the hole mobility of the PMOS.

In accordance with certain embodiments of the invention, the isolation of a PFET is carried out by internal oxidation (ITOX) of micro-cavities. In other words, a buried oxide layer (BOX) is formed by internal oxidation of micro-cavities. According to one embodiment, an $O_2^+$ implant can be introduced prior to the ITOX process. This may help to form a continuous BOX layer. For example, by means of the $O_2^+$ implant, a huge super-saturation of oxygen molecules may be introduced close to the micro-cavities. Upon the ITOX process a continuous BOX layer may then be formed by the coalescence of close-spaced $SiO_2$ precipitates. The use of the micro-cavities may help to reduce the oxygen dose needed to form a continuous BOX layer compared to a conventional SIMOX (separation by implantation of oxygen) process. In one embodiment, the oxygen dose may be reduced by a factor of, for example, 100 compared to the conventional SIMOX process.

In accordance with certain embodiments of the invention, a CMOS structure and a corresponding fabrication method are provided, which are based on a hybrid orientated technology (HOT) approach with an additional isolation of the PMOS transistor, thereby forming both NMOS and PMOS in or on SOI type substrates. This new technology may be referred to as isolated hybrid orientated technology (IsHOT).

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:
1. A method of producing a field effect transistor arrangement, comprising:
   providing a substrate having a first crystal surface orientation;
   forming a first layer above at least a first portion of the substrate, the first layer having a second crystal surface orientation different from the first crystal surface orientation;
   forming a second layer on at least a second portion of the substrate and adjacent to the first layer, the second layer having the first crystal surface orientation;
   forming a first buried oxide layer between the substrate and the first layer;
   forming micro-cavities in the second layer and oxidizing the micro-cavities, thereby forming a second buried oxide layer between the substrate and the second layer, wherein after formation of the micro-cavities and before oxidation of the micro-cavities, oxygen ions are implanted into the second layer, thereby forming oxygen rich precipitates in the second layer;
   forming a first field effect transistor in or on the first layer, the first field effect transistor having a first conductivity type; and
   forming a second field effect transistor in or on the second layer, the second field effect transistor having a second conductivity type.

2. The method as claimed in claim 1, wherein the second layer is formed by an epitaxial growth process.

3. The method as claimed in claim 1, wherein the oxygen ions are implanted with an implantation dose of approximately between $10^{15}$ cm$^{-2}$ and $10^{18}$ cm$^{-2}$.

4. The method as claimed in claim 1, wherein the oxygen ions have an implantation energy of approximately between 10 keV and 400 keV.

5. The method as claimed in claim 1, wherein the first crystal surface orientation is a (110) crystal surface orientation and wherein the second crystal surface orientation is a (100) crystal surface orientation.

6. The method as claimed in claim 1, wherein the micro-cavities are formed in the second layer by implanting light ions into the second layer.

7. The method as claimed in claim 6, wherein the light ions are selected from a group of ions consisting of:
   $H_2^+$ ions;
   $He^+$ ions;
   $F^+$ ions;
   $Ne^+$ ions;
   $Cl^+$ ions; and
   $Ar^+$ ions.

8. The method as claimed in claim 6, wherein the light ions are implanted with an implantation dose of approximately between $10^{15}$ cm$^{-2}$ and $10^{18}$ cm$^{-2}$.

9. The method as claimed in claim 6, wherein the light ions have an implantation energy of approximately between 10 keV and 150 keV.

10. The method as claimed in claim 1, wherein the micro-cavities are oxidized by a high-temperature treatment and introducing oxygen into the micro-cavities.

11. The method as claimed in claim 10, wherein the substrate is heated to a temperature of approximately between 1000° C. and 1350° C. in the context of the high-temperature treatment.

12. The method as claimed in claim 10, wherein the substrate is heated for a duration of approximately between 30 min and 2 h in the context of the high-temperature treatment.

13. The method as claimed in claim 10, wherein the oxygen is introduced into the micro-cavities by thermal indiffusion or implantation.

14. The method as claimed in claim 1, wherein at least one of the substrate, the first layer and the second layer comprises silicon.

15. The method as claimed in claim 14, wherein a silicon handle wafer is used as the substrate.

16. A method of producing a semiconductor element, comprising:
forming micro-cavities in a substrate, wherein light ions are implanted into the substrate, thereby forming the micro-cavities in the substrate;
oxidizing the micro-cavities, thereby forming a buried oxide layer in the substrate, wherein after formation of the micro-cavities and before oxidation of the micro-cavities, oxygen ions are implanted into the substrate, thereby forming oxygen rich precipitates in the substrate;
forming the semiconductor element in or on a portion of the substrate above the buried oxide layer.

17. The method as claimed in claim 16, wherein the micro-cavities are oxidized by a high-temperature treatment and introducing oxygen into the micro-cavities.

* * * * *